US007611957B2

(12) United States Patent
Nishibe et al.

(10) Patent No.: US 7,611,957 B2
(45) Date of Patent: Nov. 3, 2009

(54) METHOD OF MANUFACTURING SEMICONDUCTOR DEVICE

(75) Inventors: Eiji Nishibe, Gunma (JP); Toshihiro Hachiyanagi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 33 days.

(21) Appl. No.: 11/699,584

(22) Filed: Jan. 30, 2007

(65) Prior Publication Data
US 2007/0178636 A1 Aug. 2, 2007

(30) Foreign Application Priority Data
Jan. 30, 2006 (JP) ............................. 2006-020521

(51) Int. Cl.
*H01L 21/20* (2006.01)
(52) U.S. Cl. .................... 438/382; 438/383; 257/154; 257/350; 257/E21.004; 257/E21.005
(58) Field of Classification Search ................ 438/171, 438/190, 210, 238, 329, 330, 332, 381–383; 257/154, 350, 358–359, 363, E21.004–E21.007
See application file for complete search history.

(56) References Cited

U.S. PATENT DOCUMENTS

| 5,852,311 | A  | * | 12/1998 | Kwon et al. ................. 257/315 |
| 7,112,535 | B2 | * | 9/2006  | Coolbaugh et al. ........... 438/721 |
| 2005/0130442 | A1 | * | 6/2005 | Visokay et al. .............. 438/775 |
| 2006/0049484 | A1 | * | 3/2006 | Nomura ....................... 257/536 |

FOREIGN PATENT DOCUMENTS

JP          05-129294          5/1993

OTHER PUBLICATIONS

Polysilicon Resistors Compatible with Bipolar Integrated Circuits and Method of Manufacture. IBM Technical Disclosure Bulletin, Oct. 1982, US.*

* cited by examiner

*Primary Examiner*—W. David Coleman
*Assistant Examiner*—Su C Kim
(74) *Attorney, Agent, or Firm*—Morrison & Foerster LLP

(57) ABSTRACT

The invention provides a method of manufacturing a semiconductor device having a semiconductor resistor layer, which reduces a difference between a theoretical resistance value and a measured resistance value. An interlayer insulation film is formed on the whole surface of a semiconductor substrate, and then the interlayer insulation film is selectively etched to form contact holes partially exposing a polysilicon resistor layer, a source region and a drain region. The patterning size of the polysilicon resistor layer is designed by defining the lengths between the adjacent contact holes on the polysilicon resistor layer as the lengths of resistor elements. Then, ion implantation is performed to the polysilicon resistor layer through the contact holes to form low resistance regions (regions where high concentration of impurities are implanted) on the polysilicon resistor layer. After the ion implantation, heat treatment (annealing) is performed at lower temperature than in heat treatment for forming the source region and the drain region.

2 Claims, 4 Drawing Sheets

US 7,611,957 B2

METHOD OF MANUFACTURING SEMICONDUCTOR DEVICE

CROSS-REFERENCE OF THE INVENTION

This invention claims priority from Japanese Patent Application No. 2006-020521, the content of which is incorporated herein by reference in its entirety.

BACKGROUND OF THE INVENTION

1. Field of the Invention

The invention relates to a method of manufacturing a semiconductor device, particularly, to a method of manufacturing a semiconductor device having a resistor element.

2. Description of the Related Art

An element having a relatively high resistance value made of a polysilicon layer (hereafter, referred to as a polysilicon resistor layer) has been known as a resistor element for forming an LSI circuit mounted with an analog circuit. This polysilicon resistor layer is broadly used since forming this polysilicon resistor layer in an element separation region reduces the area of an element formation region and realizes large scale integration and reduced parasitic capacitance.

In the general LSI circuit, not only the polysilicon resistor layer but also active elements, such as a MOS transistor or a bipolar transistor, are formed on the same semiconductor substrate. Hereafter, descriptions will be given on an example of a conventional process of manufacturing a semiconductor device having a polysilicon resistor layer and a MOS transistor formed on the same semiconductor substrate, referring to FIGS. 6 to 8.

As shown in FIG. 6, field insulation films 101 for separating elements are formed on a semiconductor substrate 100 by a LOCOS method or the like. A gate insulation film 102 for the MOS transistor is formed on a surface of the semiconductor substrate 100 in a region surrounded by the field insulation films 101 by a thermal oxidation method or the like. Then, a polysilicon layer is formed on the whole surface of the semiconductor substrate 100, and ion implantation is performed thereto so as to provide resistor elements with desired resistance values. Then, the polysilicon layer is patterned by dry-etching or the like to form a polysilicon resistor layer 103 on the field insulation film 101 and form a gate electrode 104 on the gate insulation film 102.

Then, as shown in FIG. 7, for enhancing electric connection in contact formation regions of the polysilicon resistor layer 103, ion implantation is performed to the polysilicon resistor layer 103 using a resist film 105 as a mask to form low resistance regions 106a to 106c (regions where high concentration of impurities are implanted) on the polysilicon resistor layer 103.

Ion implantation is also performed to a MOS transistor formation region at the same time as when the low resistance regions 106a to 106c are formed, to form a source region 107 and a drain region 108. Then, heat treatment (annealing) is performed for about an hour at high temperature (e.g. 950° C.) to activate the implanted impurities.

Then, as shown in FIG. 8, an interlayer insulation film 109 is formed on the whole surface of the semiconductor substrate 100, and then contact holes 110 are formed therein in desired positions above the polysilicon resistor layer 103, the source region 107 and the drain region 108. Then, a metal wiring 116 is formed in each of the contact holes 110, and thus the polysilicon resistor layer 103 and the MOS transistor are electrically connected to the other elements. FIG. 9 is a schematic top plan view of the semiconductor device formed by this process. The relevant technology is disclosed in the Japanese Patent Application Publication No. H5-129294.

A resistance value R of a resistor element is obtained by R=Rs×L/W. The Rs is a sheet resistance (Ω/sp), the L is the length of the resistor element and the W is the width thereof. The patterning size (the sheet resistance Rs, the length L and the width W) of the above described polysilicon resistor layer 103 is designed in advance so as to provide the resistor element with a desired resistance value R, and not changed in the manufacturing process.

Conventionally, as shown in FIG. 7, the resistor elements are designed by defining lengths X and Y between the regions that are ion-implanted using the resist film 105 as the lengths L of the resistor elements. The X is the length between the adjacent low resistance regions 106a and 106b and the Y is the length between the low resistance regions 106b and 106c, and X=1200 μm and Y=70 μm, for example.

In the above described conventional manufacturing process, however, high temperature heat treatment (annealing) is necessarily performed after the low resistance regions are formed in order to activate the impurity regions of the other active elements. Therefore, in the high temperature heat treatment, the impurities in each of the low resistance regions 106a to 106c are diffused in a lateral direction by a certain distance Z to form low resistance regions 115a to 115c as shown in FIGS. 8 and 9. Therefore, the previously designed lengths X and Y of the resistor elements are shortened to X' and Y', thereby causing a difference between a theoretical resistance value and a measured resistance value. This difference occurs more prominently in the finer resistor elements, causing a serious problem especially for obtaining a bit of voltage by resistor-division.

Although it is possible to prevent this difference by designing the longer lengths X and Y of the low resistance regions in advance, this case causes a problem that the polysilicon resistor layer 103 occupies a large area to increase a die area.

The invention is directed to reduction of the difference between the theoretical resistance value and the measured resistance value of the resistor element and size reduction of the resistor element.

SUMMARY OF THE INVENTION

The features of the invention are as follows. The invention provides a method of manufacturing a semiconductor device including: forming an insulation film on a surface of a semiconductor substrate; forming a semiconductor resistor layer on the insulation film; forming an interlayer insulation film covering the semiconductor resistor layer; forming contact holes partially exposing the semiconductor resistor layer in the interlayer insulation film; and performing ion implantation to the semiconductor resistor layer through the contact holes to form a low resistance region on the semiconductor resistor layer.

The invention also provides a method of manufacturing a semiconductor device having a semiconductor resistor layer and a MOS transistor formed on a same semiconductor substrate, the method including: forming an element separation insulation film and a gate insulation film of the MOS transistor on a surface of the semiconductor substrate; forming the semiconductor resistor layer on the element separation insulation film; forming a gate electrode of the MOS transistor on the gate insulation film; performing first ion implantation to form a source region and a drain region of the MOS transistor; forming an interlayer insulation film having contact holes partially exposing the semiconductor resistor layer, the source region and the drain region; and performing second ion implantation to the semiconductor resistor layer through the contact holes to form a low resistance region for lowering contact resistance on the semiconductor resistor layer.

The method further includes performing first heat treatment to activate ions implanted in the first ion implantation and performing second heat treatment to activate ions implanted in the second ion implantation at lower temperature than in the first heat treatment.

The invention provides a semiconductor device which has a resistor element having a reduced difference between a theoretical resistance value and a measured resistance value and a stable resistance value.

DETAILED DESCRIPTION OF THE INVENTION

An embodiment of the invention will be described referring to figures. FIGS. 1 to 4 are cross-sectional views shown in the order of manufacturing process steps to form a device of this embodiment, and FIG. 5 is a schematic plan view of the device at the step of FIG. 4. The following description is given on a method of manufacturing a semiconductor device having a polysilicon resistor layer and a MOS transistor formed on the same semiconductor substrate, but the semiconductor device may also have an active element such as a bipolar transistor or the like on the same semiconductor substrate.

Figure 1:
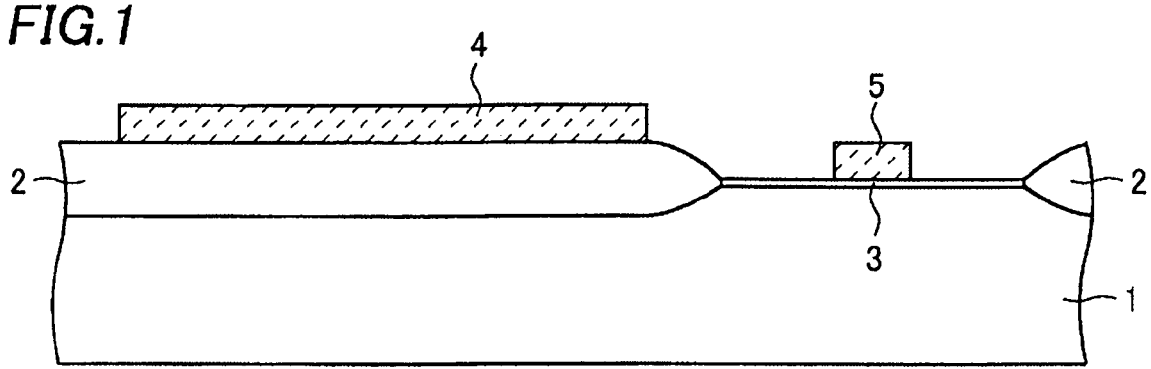
FIGS. 1 to 4 are cross-sectional views for explaining a method of manufacturing a semiconductor device of the invention.

First, as shown in FIG. 1, field insulation films 2 are formed on a surface of a semiconductor substrate 1 by a selective oxidation method to separate a MOS transistor formation region. This is the so-called LOCOS.

Then, a gate insulation film 3 of the MOS transistor is formed on the surface of the semiconductor substrate 1 in a region surrounded by the field insulation films 2 by, for example, a thermal oxidation method.

Then, a polysilicon layer having a thickness of, for example, 400 nm is formed on the whole surface of the semiconductor substrate 1 by, for example, a CVD method, and then impurities (e.g. phosphorus ion or arsenic ion) are implanted in the polysilicon layer so as to provide a polysilicon resistor layer 4 that is to be formed later with a desired sheet resistance (e.g. 5 KΩ/sq). In this ion implantation, for example, phosphorus ion is implanted therein under the condition of an acceleration voltage 70 KeV and a dose $5 \times 10^{14}/cm^2$.

Then, an oxide film (not shown) is formed on the whole surface, and the oxide film in the MOS transistor formation region is removed by etching using a resist film (not shown) as a mask. The resist film is then removed, and phosphorus doping with $POCl_3$ as a diffusion source is performed to the polysilicon layer in a region to be formed with a gate electrode 5 using the oxide film formed in a region to be formed with the polysilicon resistor layer 4 as a mask. This provides the gate electrode 5 with lower resistance than that of the polysilicon resistor layer 4. Although the phosphorus doping is performed to the polysilicon layer in the region to be formed with the gate electrode 5 in this embodiment, an ion implantation method using, for example, phosphorus ion or the like may be used instead in order to provide the gate electrode 5 with the lower resistance.

Then, the polysilicon layer is patterned by dry-etching or the like using a resist film (not shown) as a mask to form the polysilicon resistor layer 4 on the field insulation film 2 and the gate electrode 5 of the MOS transistor on the gate insulation film 3. The gate electrode 5 has the lower resistance than that of the polysilicon resistor layer 4 as described above. The above described ion implantation may be performed after the polysilicon layer is patterned.

Figure 2:
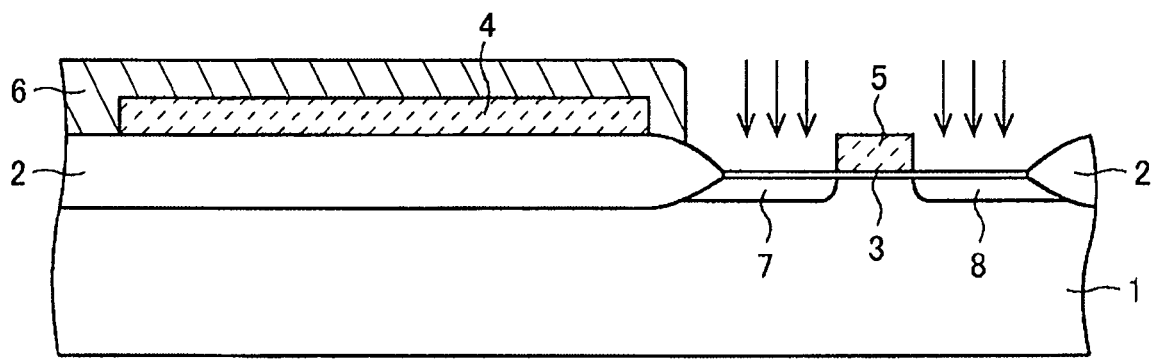

Then, as shown in FIG. 2, the polysilicon resistor layer 4 is covered with a resist film 6, and impurities (e.g. phosphorus ion or arsenic ion) are implanted in the surface of the semiconductor substrate 1 to form a source region 7 and a drain region 8 of the MOS transistor. In this ion implantation, for example, phosphorus ion is implanted under the condition of an acceleration voltage 70 KeV and a dose $1 \times 10^{14}/cm^2$, or arsenic ion is implanted under the condition of an acceleration voltage 80 KeV and a dose $6 \times 10^{15}/cm^2$. Then, heat treatment (annealing) is performed at high temperature (e.g. 950° C.) for about an hour to activate the implanted carriers.

Figure 3:
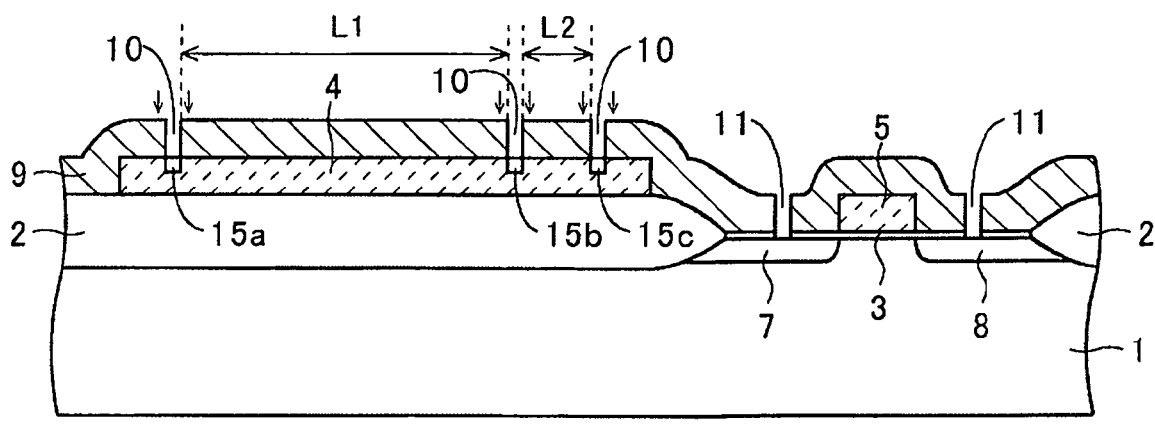

Then, as shown in FIG. 3, an interlayer insulation film 9 (e.g. a silicon nitride film and a BPSG film formed by a CVD method) is formed on the whole surface of the semiconductor substrate 1. Then, a heat treatment is performed to the interlayer insulation film 9 to smooth and planarize the surface of the interlayer insulation film 9 (the BPSG film). The temperature of this heat treatment may be 950° C. or lower, or even higher than 950° C. Then, this interlayer insulation film 9 is selectively etched to form contact holes 10 and 11 partially exposing the polysilicon resistor layer 4, the source region 7 and the drain region 8. The diameter of each of the contact holes 10 and 11 is about 1.6 μm, for example.

Then, impurities (e.g. phosphorus ion or arsenic ion) are implanted in the polysilicon resistor layer 4 through the contact holes 10 to form low resistance regions 15a to 15c (regions where high concentration of impurities are implanted) thereon. The formation of these low resistance regions 15a to 15c is for reducing a contact resistance with a metal wiring and enhancing the electrical connection in a contact region as described above. In this ion implantation, for example, phosphorus ion is implanted under the condition of an acceleration voltage 80 KeV and a dose $2 \times 10^{15}/cm^2$. In this ion implantation process, in a region to be formed with the active elements of the MOS transistor or the like, the contact holes 11 may be covered with a resist film or the like to avoid the ion implantation in this region.

It is noted that a high temperature heat treatment is not performed after the contact holes 10 and 11 are formed in order to prevent degradation of device characteristics. In this embodiment, after the low resistance regions 15a to 15c are formed, all heat treatments (annealing), including the heat treatment for activating the implanted carriers, are performed at a temperature 900° C. or lower, or preferably 800° C. or lower, which is lower than the annealing temperature of the source and drain region activation, i.e., 950° C. Heat treatment time for activating the carriers implanted in the low resistance regions 15a to 15c is about 30 to 60 minutes, for example. Therefore, compared with a conventional method of manufacturing a semiconductor device, impurity ions implanted in the low resistance regions 15a to 15c are hardly diffused in the horizontal direction. Therefore, a difference between a theoretical resistance value and a measured resistance value is reduced by designing the patterning sizes of the resistor elements by defining the lengths between the adjacent contact holes as the lengths L1 and L2 of the resistor elements. For example, L1=1200 μm and L2=70 μm.

The interlayer insulation film 9 (the BPSG film) is also subjected to the heat treatment in this activation process, and thus the shapes of the contact holes 10 and 11 formed in the interlayer insulation film 9 are formed smooth. Therefore, end portions of the contact holes 10 and 11 are rounded and a metal wiring 16 that will be described below is formed advantageously.

When the heat treatment is to be performed for activating the implanted carriers and for rounding the end portions of the contact holes 10 and 11 in the same process as described above, it is preferable to perform the heat treatment at temperature higher than 700° C. (e.g. 800 to 900° C.) for softening the interlayer insulation film 9 (the BPSG film). The heat treatment at temperature higher than 700° C., for example, is sufficient to perform the activation process only.

Figure 4:
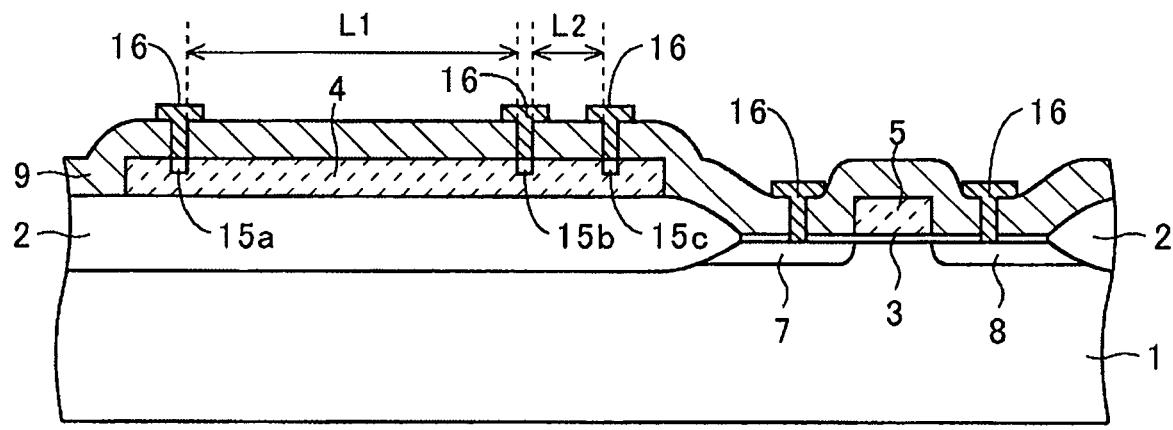
Figure 5:
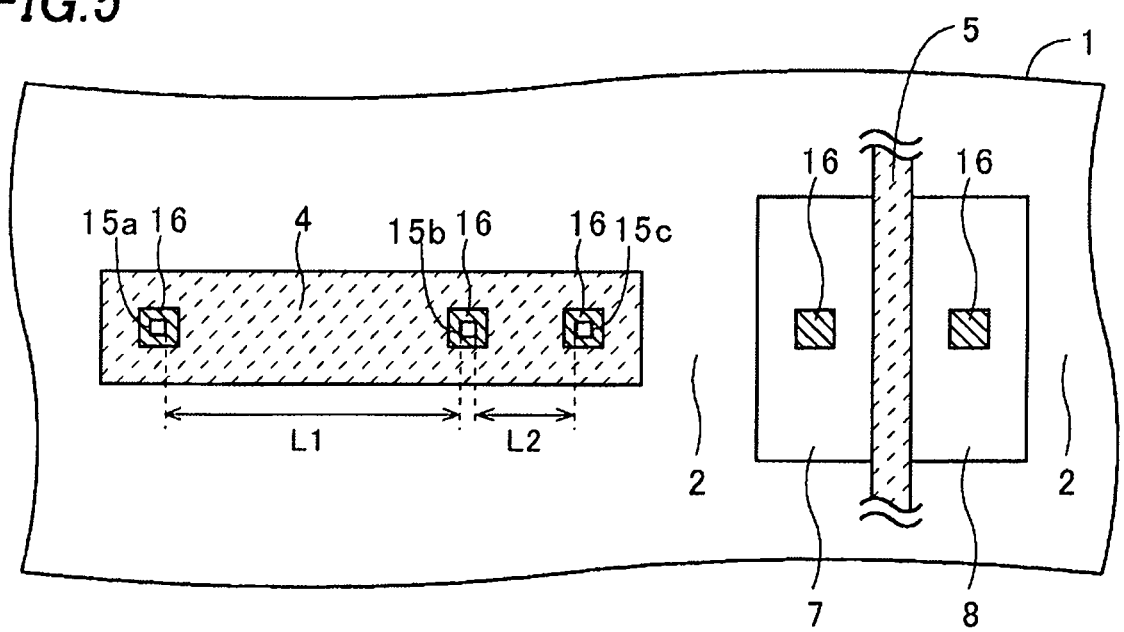
FIG. 5 is a plan view for explaining the method of manufacturing the semiconductor device of the invention.
Figure 6:
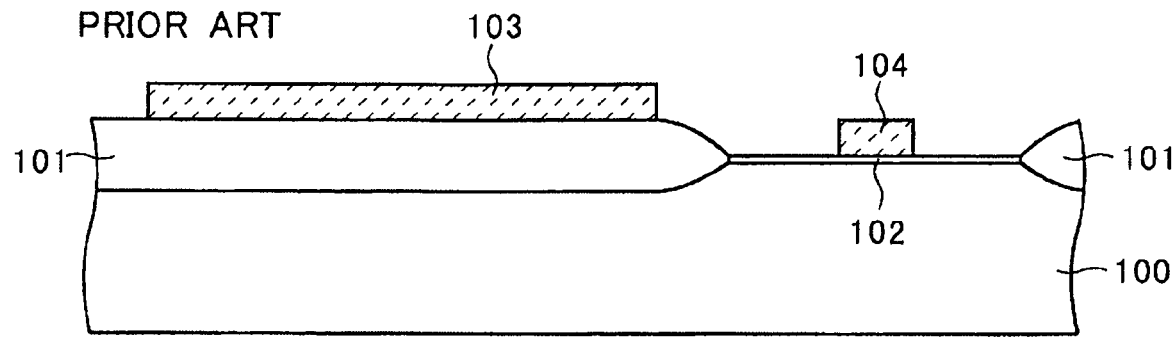
FIGS. 6 to 8 are cross-sectional views for explaining a conventional method of manufacturing a semiconductor device.
Figure 7:
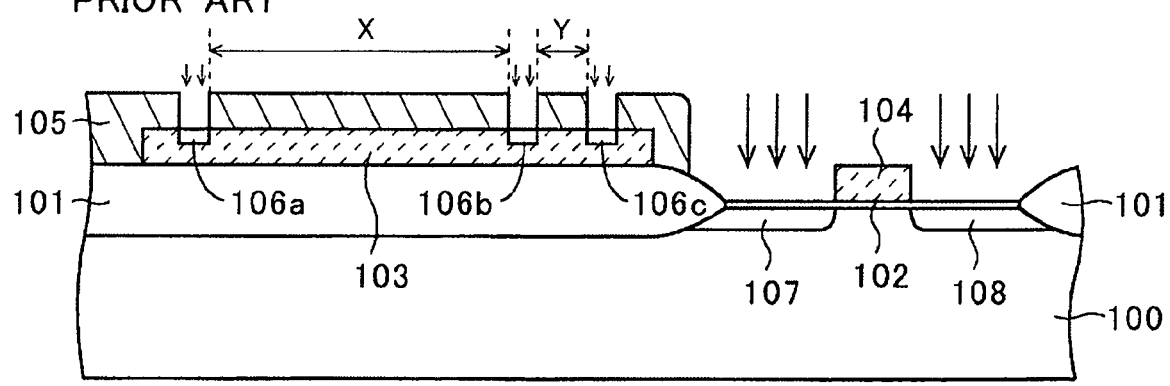
Figure 8:
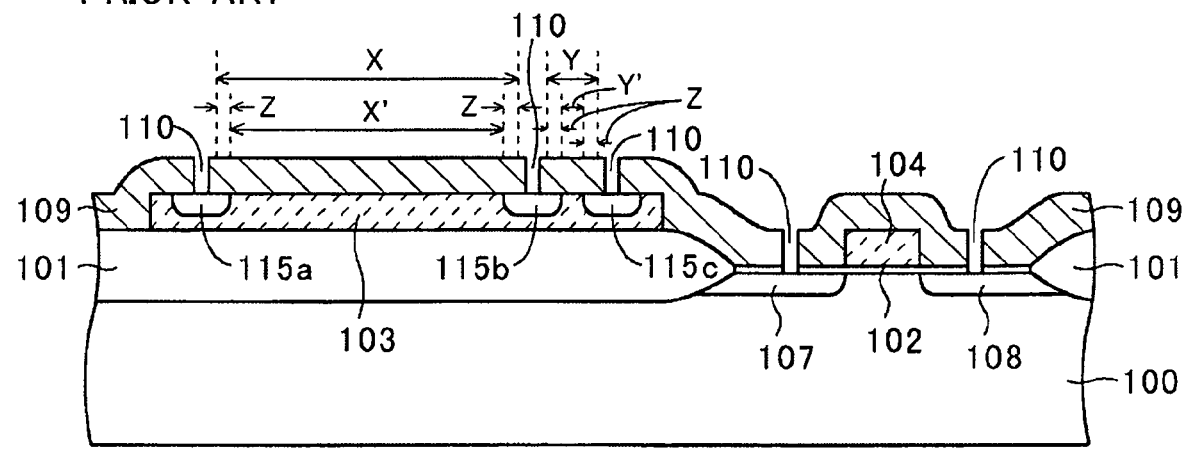
Figure 9:
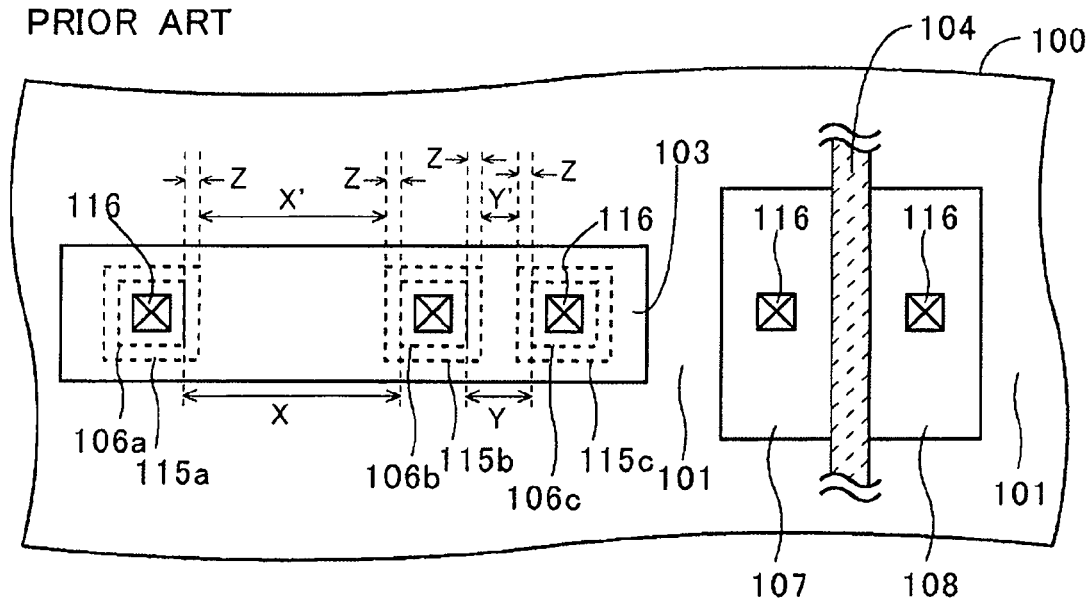
FIG. 9 is a plan view for explaining the conventional method of manufacturing the semiconductor device.

Then, as shown in FIG. 4, the metal wiring 16 made of aluminum, titanium or the like is formed in each of the contact holes by a sputtering method or the like, and thereby the polysilicon resistor layer 4 and the MOS transistor are electrically connected to the other elements.

As described above, in this embodiment, the ion implantation and the heat treatment (annealing) to the low resistance regions 15a to 15c of the polysilicon resistor layer 4 are performed after the contact holes 10 and 11 are formed. This manufacturing method does not have such high temperature heat treatment that the LSI operation characteristics is degraded after the formation of the contact holes as described above. Therefore, the impurities of the low resistance regions 15a to 15c are hardly diffused, and thus the resistance value that is almost the same as the theoretical resistance value is obtained by defining the length between the adjacent contact holes as the length L of the resistor element region. it was found that while a difference between an output voltage and a theoretical value is about 10% when a polysilicon resistor layer is used for the resistor-division by a conventional manufacturing method, the manufacturing method of this embodiment achieves the difference less than 1%.

Therefore, the method of this embodiment realizes a semiconductor device of which a theoretical resistance value and a measured resistance value are almost the same and a resistance value is stable without increasing the area of a semiconductor resistor layer. This is preferable particularly for enhancing the accuracy in the resistor-division of an output voltage like in this embodiment.

Furthermore, since the interlayer insulation film 9 formed with the contact holes 10 and 11 is used as the mask for forming the low resistance regions 15a to 15c, the number of masks is not increased and the manufacturing cost is also not increased.

Although the above described embodiment is described for the case where three contact holes are formed in the polysilicon resistor layer 4 and the output voltage is resistor-divided, a plurality of contact holes may be further formed therein or a simple resistor element formed with two contact holes may be used instead.

Furthermore, modifications of the invention are possible within the scope of the invention without being limited to the above described embodiment, and the invention is generally applicable to a method of manufacturing a semiconductor device having a resistor element.

What is claimed is:

1. A method of manufacturing a semiconductor device, comprising:
   providing a semiconductor substrate;
   forming an element separation insulation film on the substrate;
   forming a gate insulation film on the substrate;
   forming a semiconductor resistor layer on the element separation insulation film;
   forming a gate electrode on the gate insulation film;
   performing a first ion implantation into the substrate so as to form a source region and a drain region adjacent the gate electrode;
   performing a first heat treatment to activate the source and drain regions after the first ion implantation;
   forming an interlayer insulation film having contact holes exposing part of the semiconductor resistor layer, part of the source region and part of the drain region;
   performing, after the first heat treatment, a second ion implantation into the semiconductor resistor layer through the contact holes to form low resistance regions in the semiconductor layer for electrical contact; and
   performing a second heat treatment to activate ions implanted in the second ion implantation at a temperature lower than in the first heat treatment.

2. The method of claim 1, wherein the semiconductor resistor layer comprises a polysilicon layer.

* * * * *